(12) United States Patent
Ellersick

(10) Patent No.: US 7,692,468 B1
(45) Date of Patent: Apr. 6, 2010

(54) VOLTAGE CLAMP

(75) Inventor: William F. Ellersick, Sudbury, MA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/234,046

(22) Filed: Sep. 19, 2008

(51) Int. Cl.
H03K 5/08 (2006.01)

(52) U.S. Cl. .................. 327/315; 327/312; 327/313; 327/316; 327/318

(58) Field of Classification Search .......... 327/312, 327/313, 315, 316, 318
See application file for complete search history.

(56) References Cited

U.S. PATENT DOCUMENTS

| 4,644,198 | A | * | 2/1987 | Ahmed | 327/321 |
| 5,465,067 | A | * | 11/1995 | Anderson | 327/322 |
| 5,500,617 | A | * | 3/1996 | Tsugita | 327/321 |
| 5,923,203 | A | * | 7/1999 | Chen et al. | 327/318 |
| 6,784,702 | B1 | * | 8/2004 | Chen | 327/110 |
| 7,518,436 | B1 | * | 4/2009 | Hariman | 327/540 |
| 7,570,524 | B2 | * | 8/2009 | Bedeschi et al. | 365/189.06 |

* cited by examiner

Primary Examiner—Kenneth B. Wells
(74) Attorney, Agent, or Firm—Sam Talpalatsky; Nicholas J. Pauley; Peter M. Kamarchik

(57) ABSTRACT

An active over-voltage clamp system includes at least one over-voltage detector that is responsive to an input voltage and provides a first current. The system also includes a replica over-voltage circuit that provides a second current, and circuitry subtracting the second current from the first current to produce a difference current. The system further includes a differential clamp activated in response to the difference current. The differential clamp prevents the input voltage from increasing beyond a target voltage.

22 Claims, 20 Drawing Sheets

VOLTAGE CLAMP

FIELD OF DISCLOSURE

The present disclosure relates to electronic circuits. More specifically, the present disclosure relates to over-voltage clamping circuitry.

BACKGROUND

In wireless data networking, there is a trend toward data converters with higher operating speeds. One design challenge in creating higher speed data converters is to create amplifiers that can rapidly charge, discharge, and amplify signals onto large capacitors. The charging, discharging, and amplifying generally consumes a significant portion of the power in data converters that include such amplifiers.

Parasitic capacitances of the components of amplifiers tend to be a limiting factor in the speed of these amplifiers. Parasitic capacitance effectively puts a limit on the speed of amplifying voltages and getting the voltages to settle accurately. Parasitic capacitance also puts a limit on the clock rates of data converters. Nevertheless, wireless data networking standards continue to look for broadband data and require high sample rates in data converters.

Many designers tend to choose higher voltage amplifiers in order to increase Signal to Noise Ratios (SNRs), since increased SNRs can often facilitate higher speed data processing. Thus, one traditional approach for designing data converters is to simply burn more power in an amplifier by making the amplifier use a higher supply voltage. However, higher voltage transistors (e.g., thick-oxide devices), used to make higher voltage amplifiers, tend to have larger parasitic capacitance than do lower voltage transistors (e.g., thin-oxide devices). The SNR gained from increasing power usage is offset by reduced speed due to increased parasitic capacitance.

Another traditional design approach is to use folded cascode amplifiers. Folded cascode amplifiers provide greater speed and smaller parasitic capacitance than unfolded cascodes, but they also tend to use at least twice as much current. A third traditional approach is to accept the limitations and go with lower-speed data converters.

SUMMARY

Various embodiments of the invention are directed to a clamp that prevents large voltages from being seen across a thin-oxide device. In one example, the thin-oxide device is a one-volt device that is used in an otherwise 2.5 volt amplifier. The clamp regulates the voltage to the thin-oxide device, thereby protecting the device from over-voltage situations. The effective voltage regulation of the clamp can help to ensure the reliability of the thin-oxide device. The end result, in many embodiments, is that a faster amplifier can be built around thin-oxide transistors, since thin-oxide transistors tend to be faster and subject to less parasitic capacitance than their thick-oxide counterparts.

Other embodiments are directed to methods of providing voltage regulation. An example method includes producing a first current that corresponds to an input voltage (e.g., an input voltage of a thin-oxide device). A second current is also produced, which corresponds to a target level of the input voltage. The second current is subtracted from the first current, and any positive difference current is input to a clamping circuit. The clamping circuit uses the difference current to produce a fourth current. The fourth current is applied to one or more nodes to regulate the input voltage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIGS. 2-5 generally use the following notational format: Using M2 in the upper right of FIG. 2D as an example, TP indicates a transistor, PMOS, 2.5V (thick oxide), while TN would indicate a transistor, NMOS, core 1.3V (thin oxide); "50/0.4" indicates a width/length/width of a transistor gate in microns; m=8 indicates a multiplier factor of 8 (8 identical transistors in parallel); mp=25 is the number of fingers (thus 25 fingers of width=2 for total width=50). Furthermore, looking at FIG. 2B, pdnB is an active low, inverted version of the pdn signal, and pdnD is a slightly delayed version of pdn, active high, after passing through two inverters for isolation purposes. "pdnD<3:0>" refers to an array of 4 signals: pdnD<0>, pdnD<1>, pdnD<2>, pdnD<3>. Similarly, "M71<1:0>" refers to an array of two transistors, M71<1> and M71<0>.

DETAILED DESCRIPTION

Figure 1:
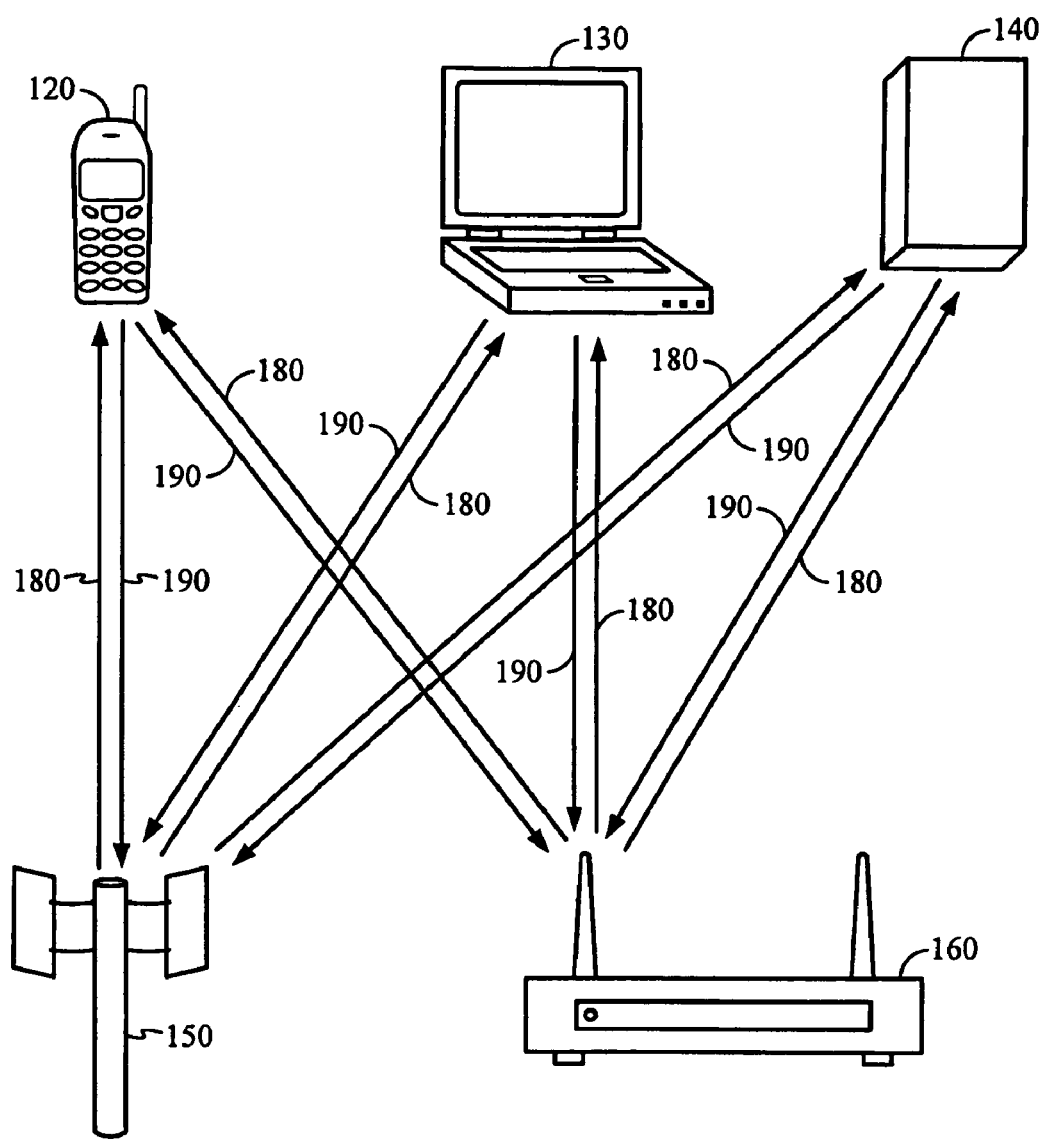
FIG. 1 is a block diagram showing an exemplary wireless communication system in which an embodiment of the invention may be advantageously employed.

FIG. 1 shows an exemplary wireless communication system 100 in which an embodiment of the invention may be advantageously employed. For purposes of illustration, FIG. 1 shows three remote units 120, 130, and 140 and two base stations 150, 160. It will be recognized that typical wireless communication systems may have many more remote units and base stations. Remote units 120, 130, and 140 can include any of a variety of memory units, including, e.g., improved full-swing memory arrays. Remote units 120, 130, and 140 can also include any of a variety of other components, such as Analog to Digital Converters (ADCs), Digital to Analog Converters (DACs), processors, delta sigma data converters, and the like. Embodiments of the invention can find use in various components, and especially in data converters, such as ADCs and DACs. FIG. 1 shows forward link signals 180 from the base stations 150, 160 to the remote units 120, 130, and 140 and reverse link signals 190 from the remote units 120, 130, and 140 to base stations 150, 160.

Generally, remote units may include cell phones, handheld personal communication systems (PCS) units, portable data units such as personal data assistants, fixed location data units such as meter reading equipment, and/or the like. In FIG. 1, remote unit 120 is shown as a mobile telephone, remote unit 130 is shown as a portable computer, and remote unit 140 is shown as a fixed location remote unit in a wireless local loop system. Base stations 150, 160 can be any of a variety of wireless base stations, including, e.g., cellular telephone base stations, wireless network access points (e.g., IEEE 802.11 compliant access points), and the like. Although FIG. 1 illustrates remote units according to the teachings of the invention, the invention is not limited to these exemplary illustrated units.

Figure 2:
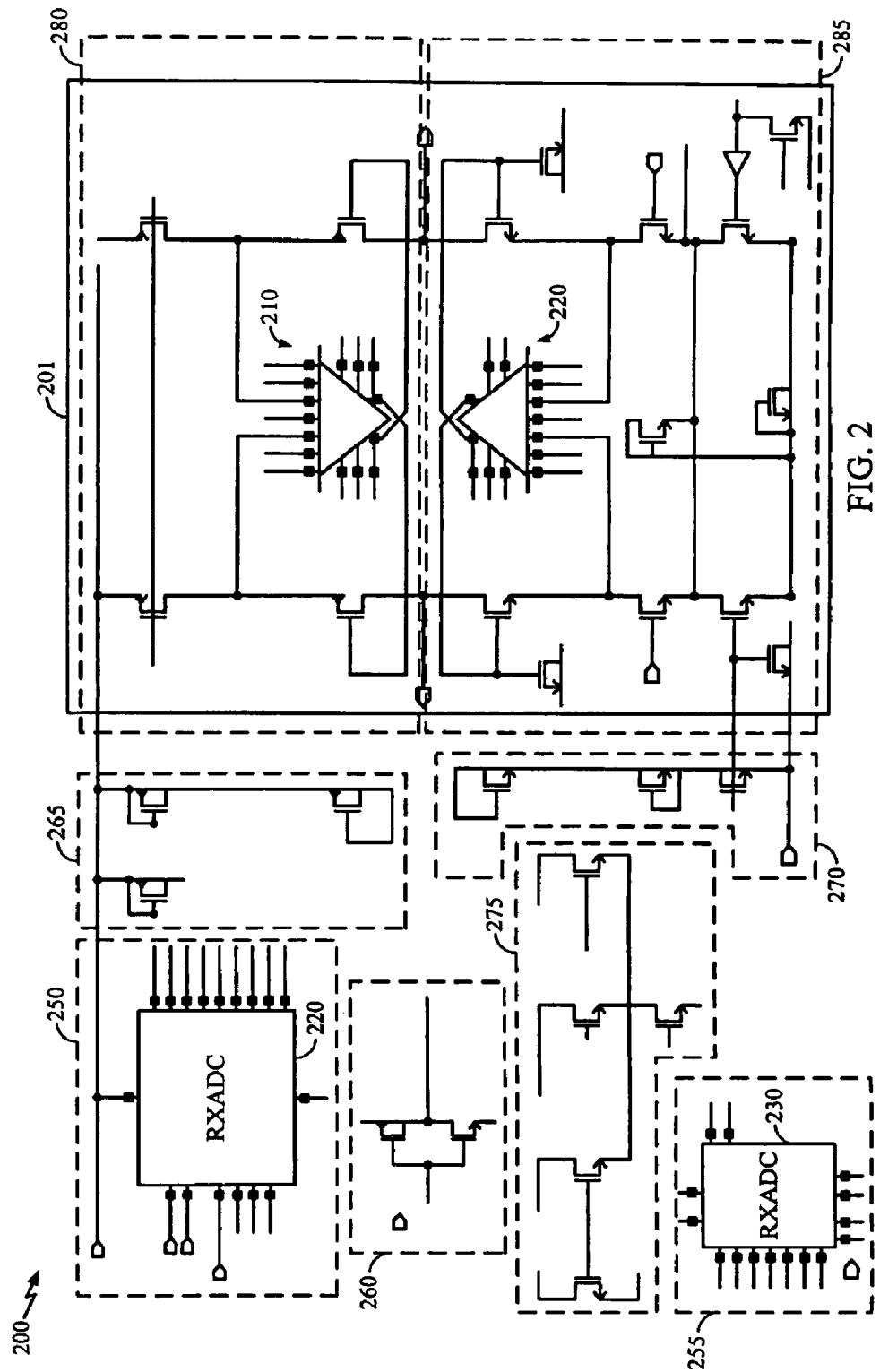
FIGS. 2-2E are an illustration of an exemplary amplifier adapted according to one embodiment of the invention.
Figure 2A:
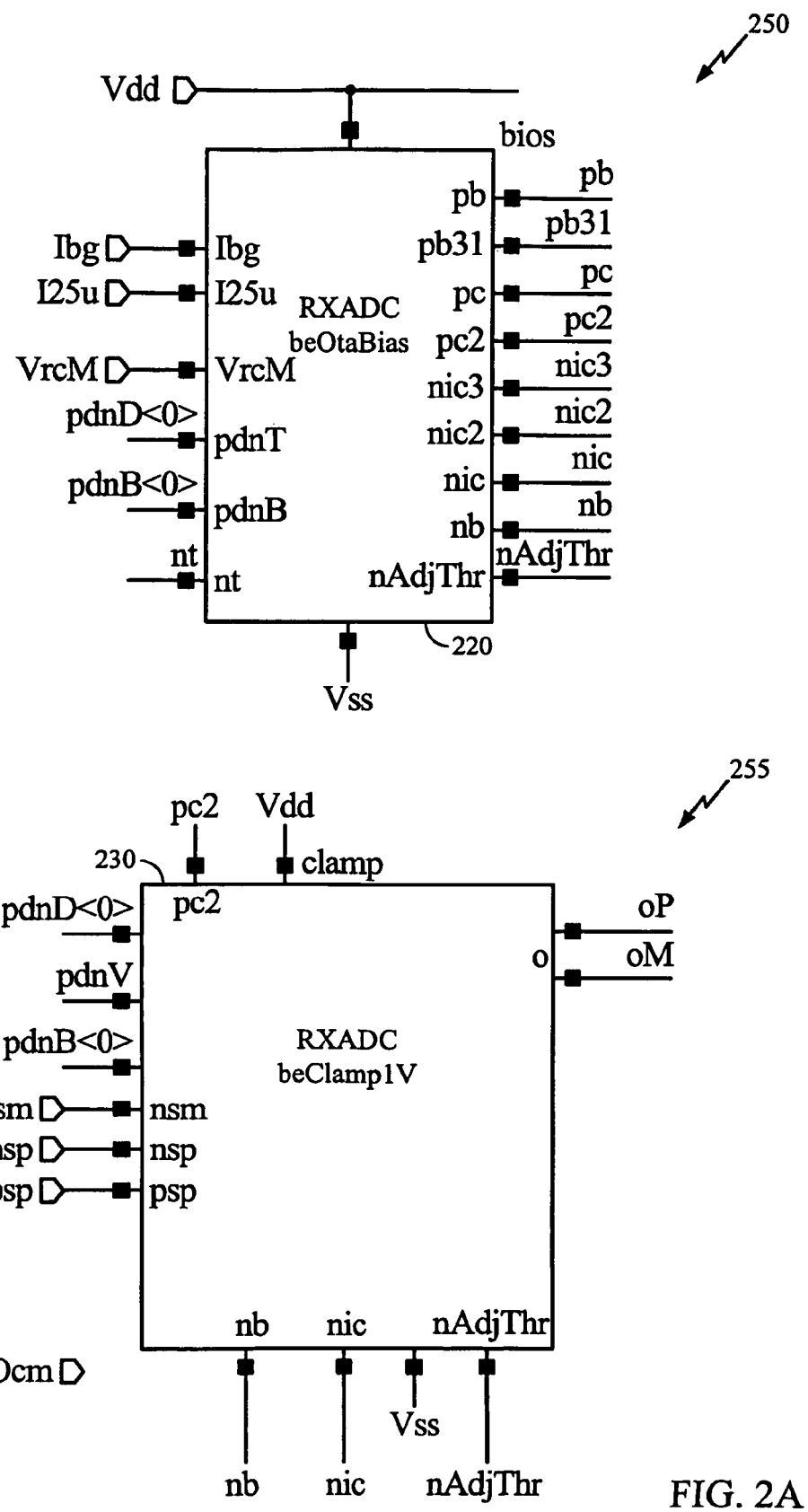
Figure 2B:
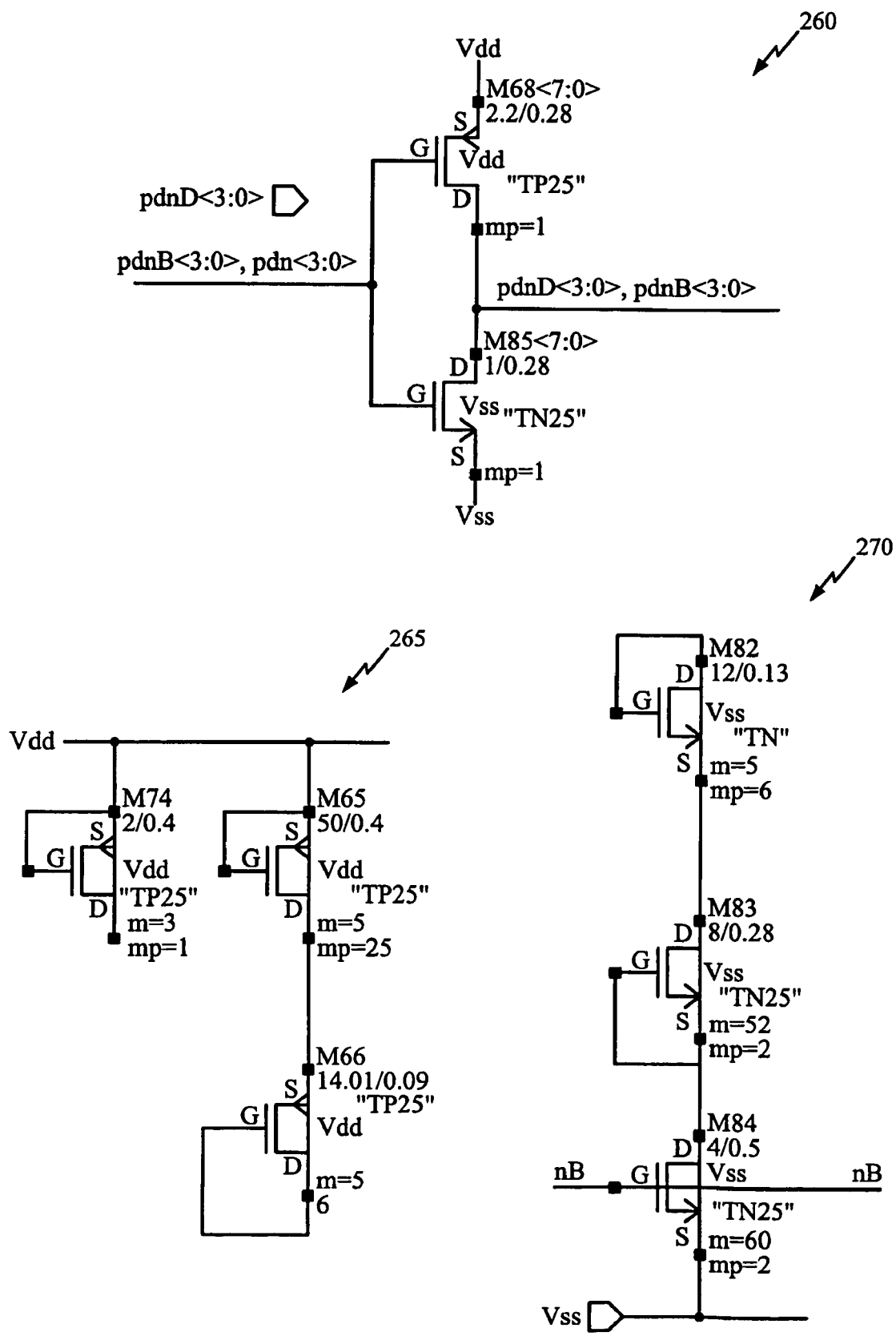
Figure 2C:
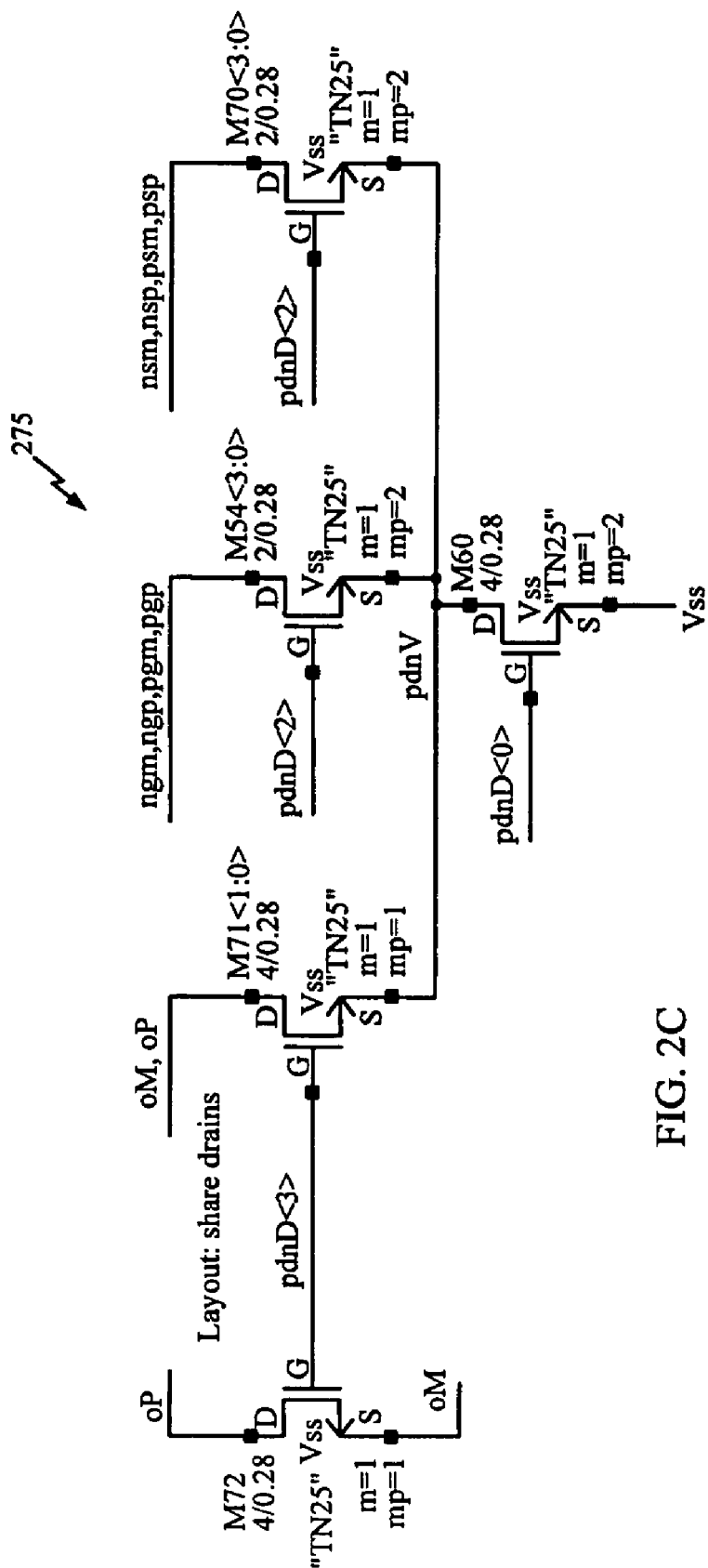

FIG. 2 is an illustration of exemplary amplifier 200 adapted according to one embodiment of the invention, and FIG. 2 is accompanied by FIGS. 2A-E, which show various portions of exemplary amplifier 200 in greater detail. In the exemplary embodiment shown, clamp 230 regulates voltages for thin-oxide transistors M0, M1, M14, and M15. The operation of amplifier 200 is described in detail below.

Amplifier 200 may be employed in any of a variety of devices, including, but not limited to, data conversion devices. In this example, amplifier 200 is an Operational Transconductive Amplifier (OTA), which is a type of operational amplifier. Core amplifier portion 201 includes two boost amplifiers 210, 220, the outputs of which are labeled oM and oP. Core amplifier portion 201 also includes input ports iM and iP that feed into the gates of transistors M12 and M13. The differential input voltage at ports iM and iP is converted into a current by transistors M12 and M13, which have a constant current bias as well as common mode control. A constant current flowing into the sources of transistors M12 and M13 will cause transistors M12 and M13 to amplify the differential input voltage and produce a differential current onto nodes nsm and nsp.

Amplifier 200 also includes cascode transistors M14 and M15, which increase the output impedance of core amplifier 201. Further enhancing the effect of cascode transistors M14 and M15 is boost amplifier 220, which adjusts the gate voltages (on nodes ngp and ngm) of cascode transistors M14 and M15 such that their sources are almost completely insensitive to the differential output voltage at oM and oP. Thus, the current coming out of transistors M12 and M13 is almost unchanged by a change in the output voltage of core amplifier 201. The operation of boost amplifier 210 and transistors M0 and M1 is substantially the same as that described above with respect to boost amplifier 220 and transistors M14 and M15 (note that "TN" in FIG. 2 indicates an n-type transistor, whereas as "TP" indicates a p-type transistor). Transistors M2 and M3 act as constant current sources to provide high impedance loads for the current from input transistors M14 and M15.

The high output impedance of core amplifier portion 201 allows amplifier 200 to add and subtract voltages onto capacitors (not shown), as well as to amplify voltages, all in a highly linear fashion enabled by the very high gain of amplifier 200. In the particular embodiment shown, the circuitry of boost amplifiers 210 and 220, as well as the surrounding transistors, operates in the range of 2.5V. However, transistors M14 and M15, as well as M0 and M1, are implemented as thin-oxide devices that operate in the 1.3V range. Various embodiments of the invention operate to regulate voltage at one or more terminals of transistors M0, M1, M14, and M15 to ensure reliability and operability of those lower-voltage, thin-oxide transistors. In normal operation, transistors M0, M1, M14, and M15 do not typically see high voltages because there is a constant current flowing through them. Generally, protection is provided to transistors M0, M1, M14, and M15 only when very large voltages are driven into amplifier 200 during power up and power down.

Amplifier 200 also includes clamp 230 and bias circuit 220. Clamp 230 has nsm, nsp, psm and psp nodes, among others, as inputs. The outputs of core amplifier 210 (oM and oP) are used by clamp 230 as inputs and outputs (which is explained in more detail below). Clamp 230 also has bias inputs, the most relevant to this discussion being the nAdjThr signal, which is described in more detail below. In short, clamp 230 clamps the voltage at oM and oP, thereby protecting transistors M0, M1, M14, and M15 from over-voltage conditions. The nAdjThr signal is one signal that is used to control the clamping procedure, ensuring no degradation during normal operation, but effective and accurate clamping when voltage exceeds normal operating voltages due to overly large input voltage to amplifier 200.

Bias circuit 220 provides various bias voltages for amplifier 200, including the nAdjThr signal. The transistors between bias circuit 220 and clamp 230 (e.g., M71 and M54) are used for generating power down signals with various delays and shorting various nodes of the amplifier together so that the power down and power up process is sequenced in a way that keeps the transistors protected.

Figure 3:
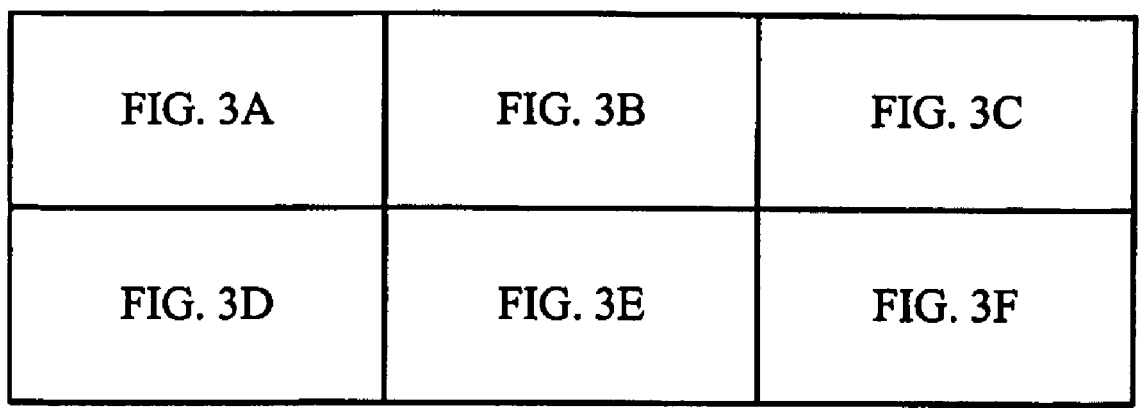
FIGS. 3-3F are an illustration of a biasing circuit for use in the amplifier of FIG. 2.
Figure 3A:
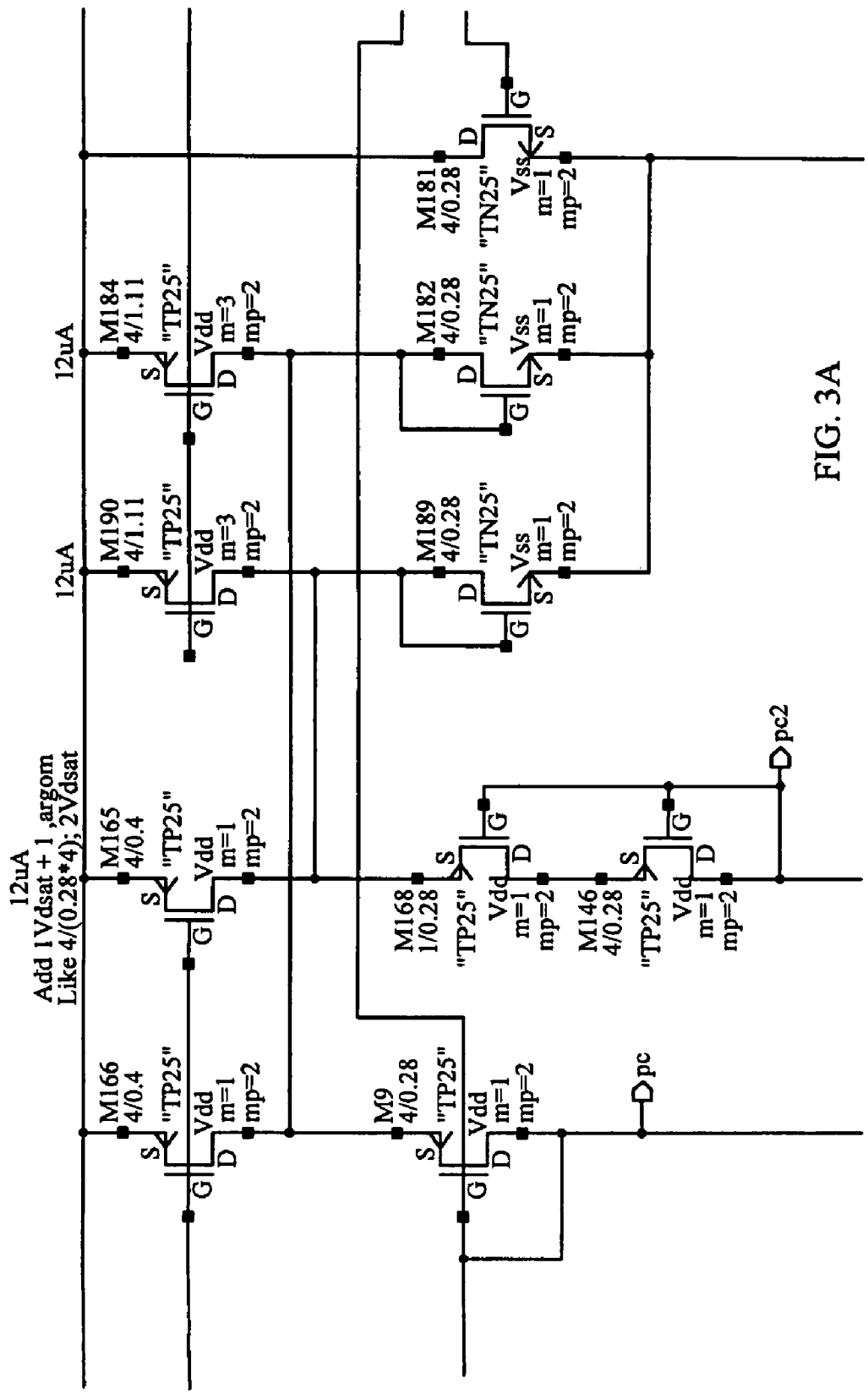
Figure 3B:
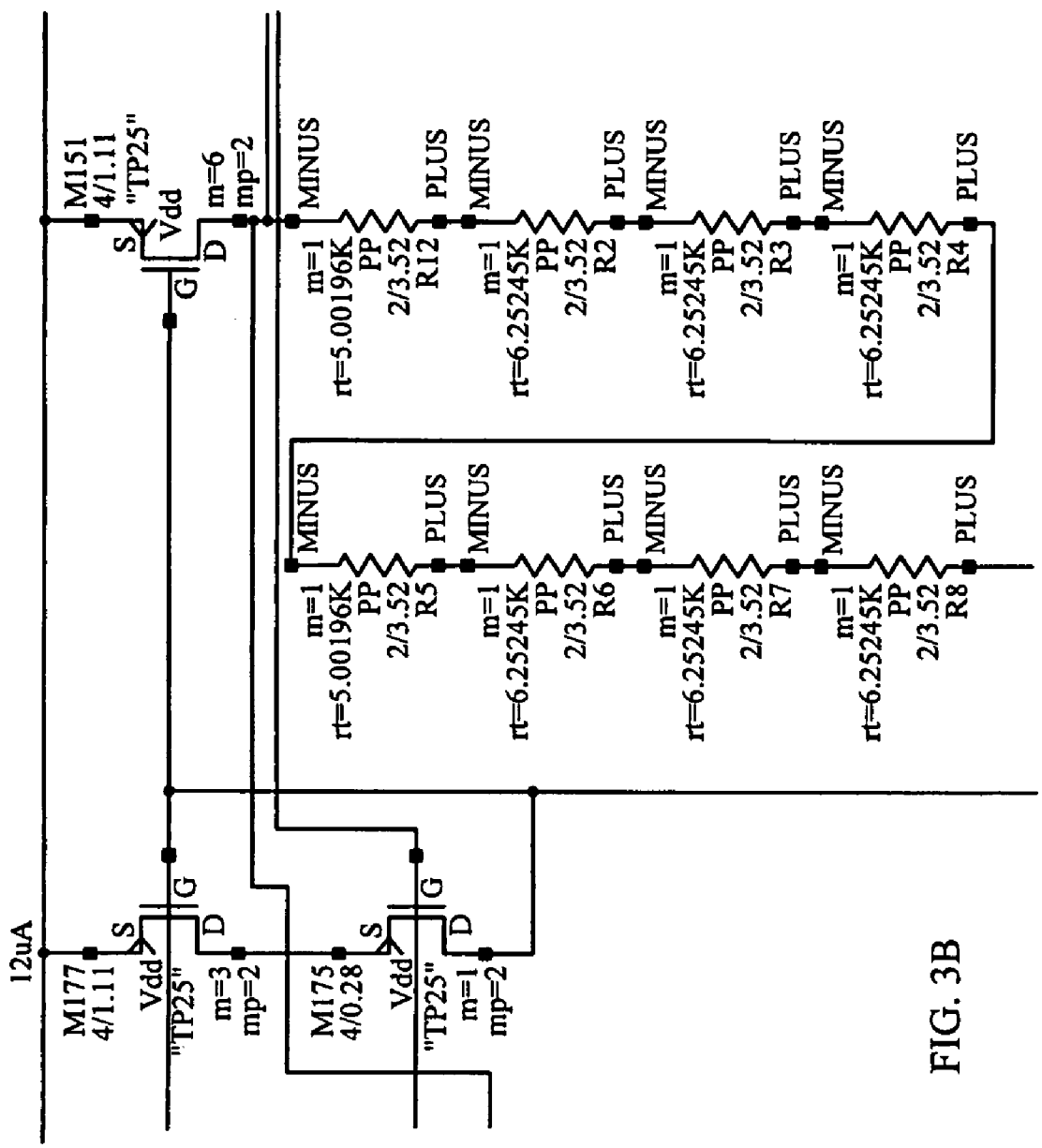
Figure 3C:
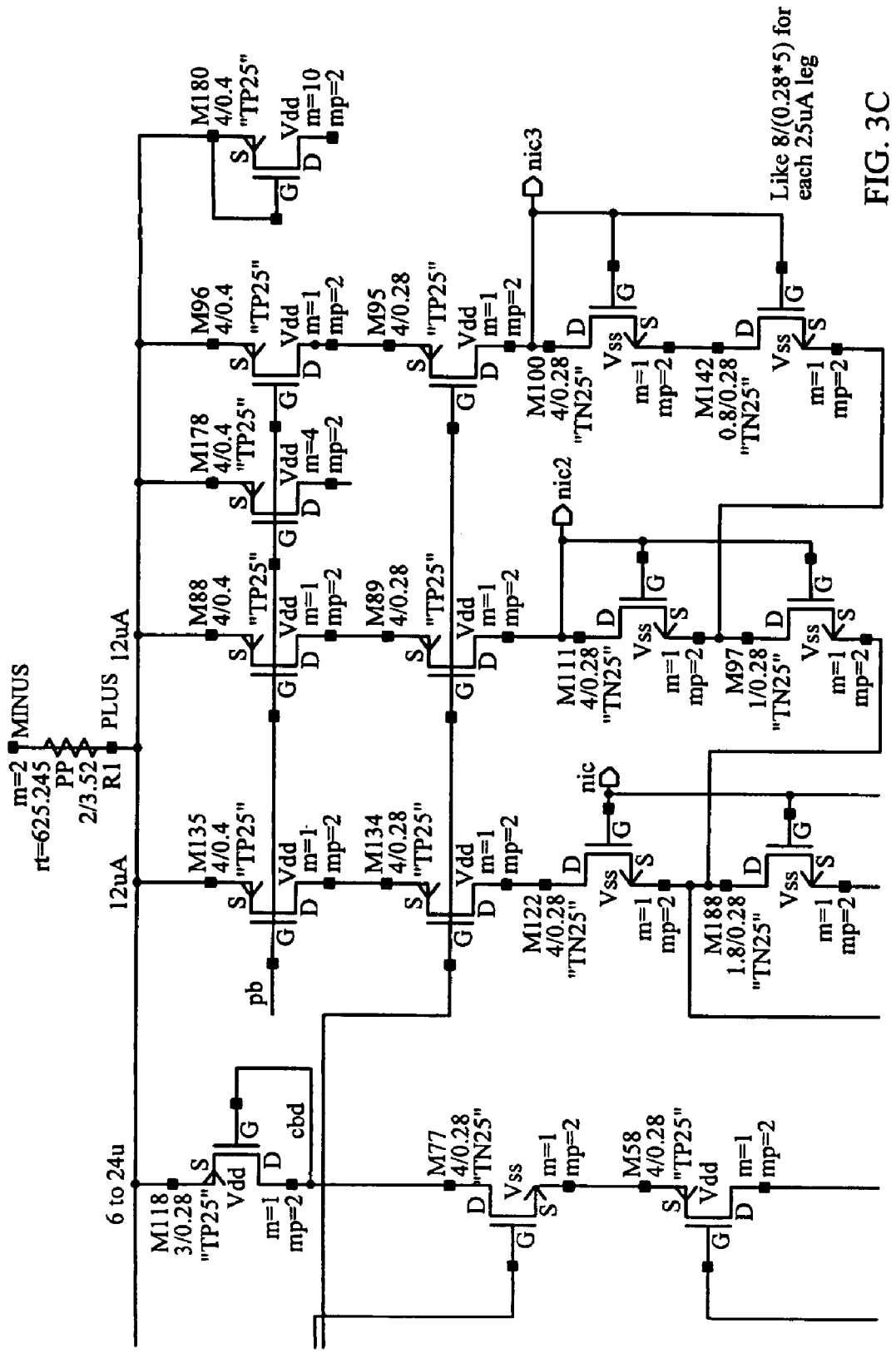
Figure 3D:
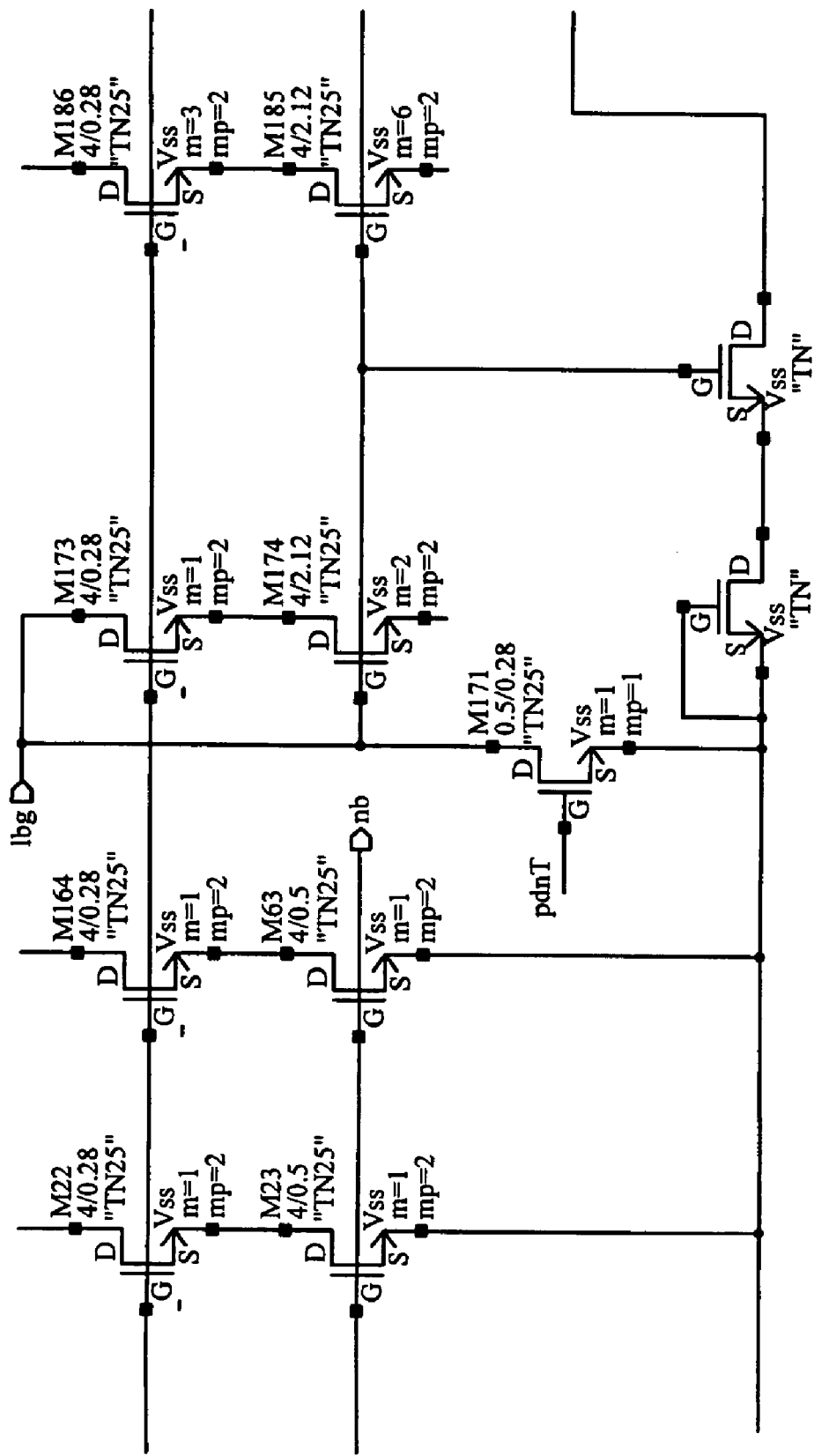
Figure 3E:
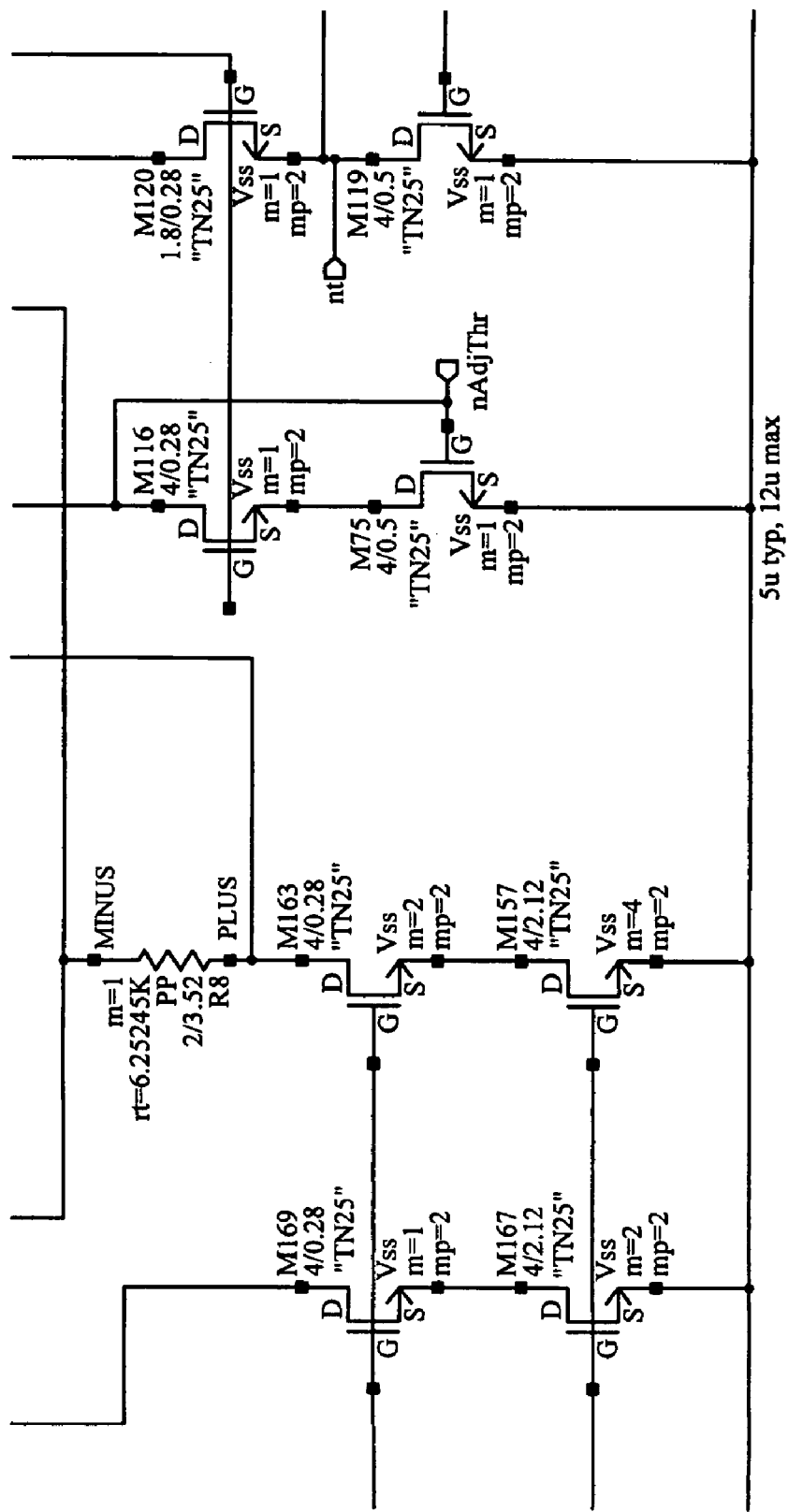
Figure 3F:
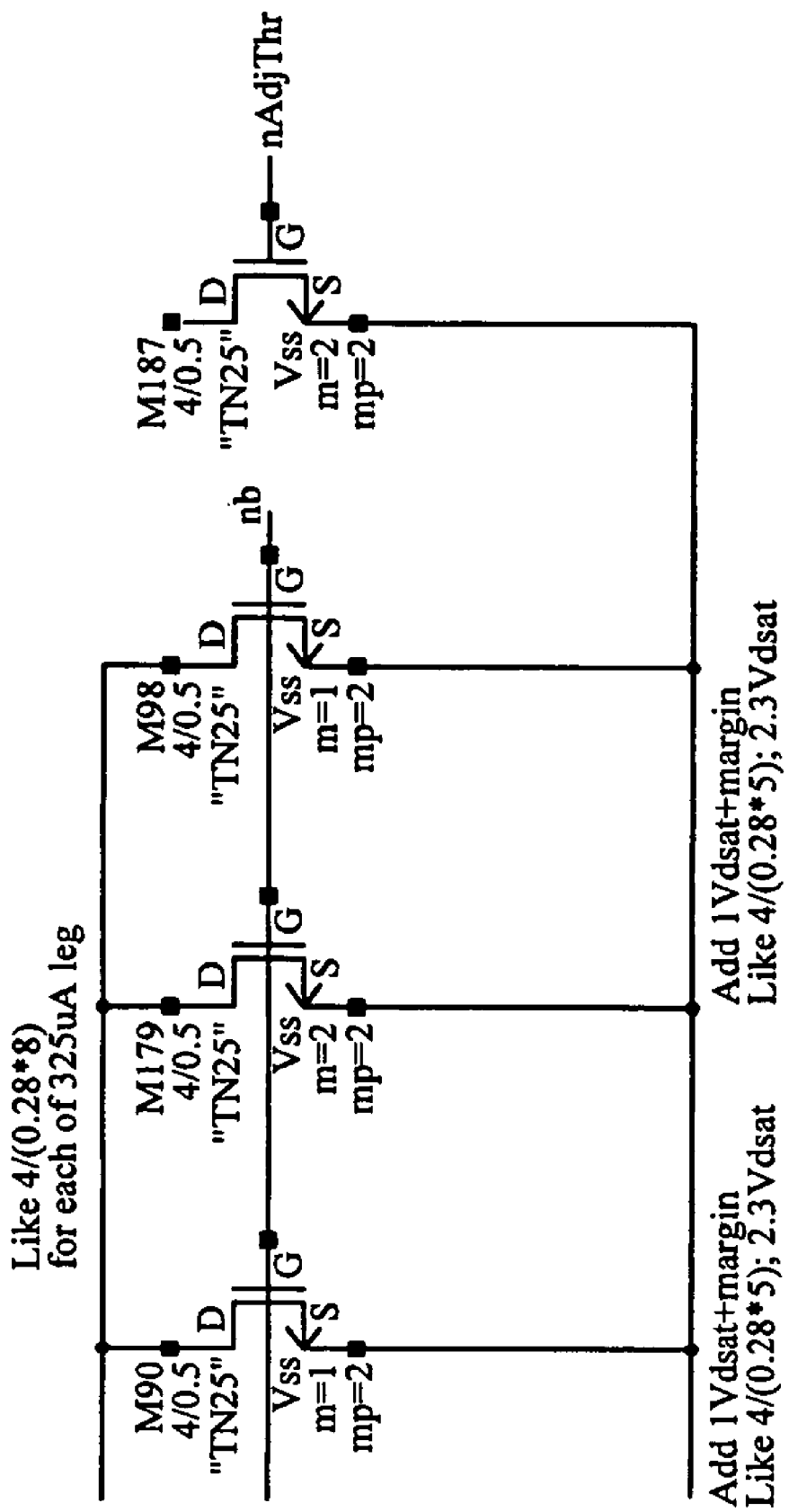

FIGS. 3A-F, together, are an illustration of an exemplary embodiment of bias circuit 220 for use in exemplary amplifier 200, and FIG. 3 shows how various portions of exemplary bias circuit 220 are arranged in FIGS. 3A-F. Bias circuit 220 includes a clamp sensor replica configured using transistors M77 (an NMOS transistor) and M58 (a PMOS transistor) (FIG. 3C).

Figure 5:
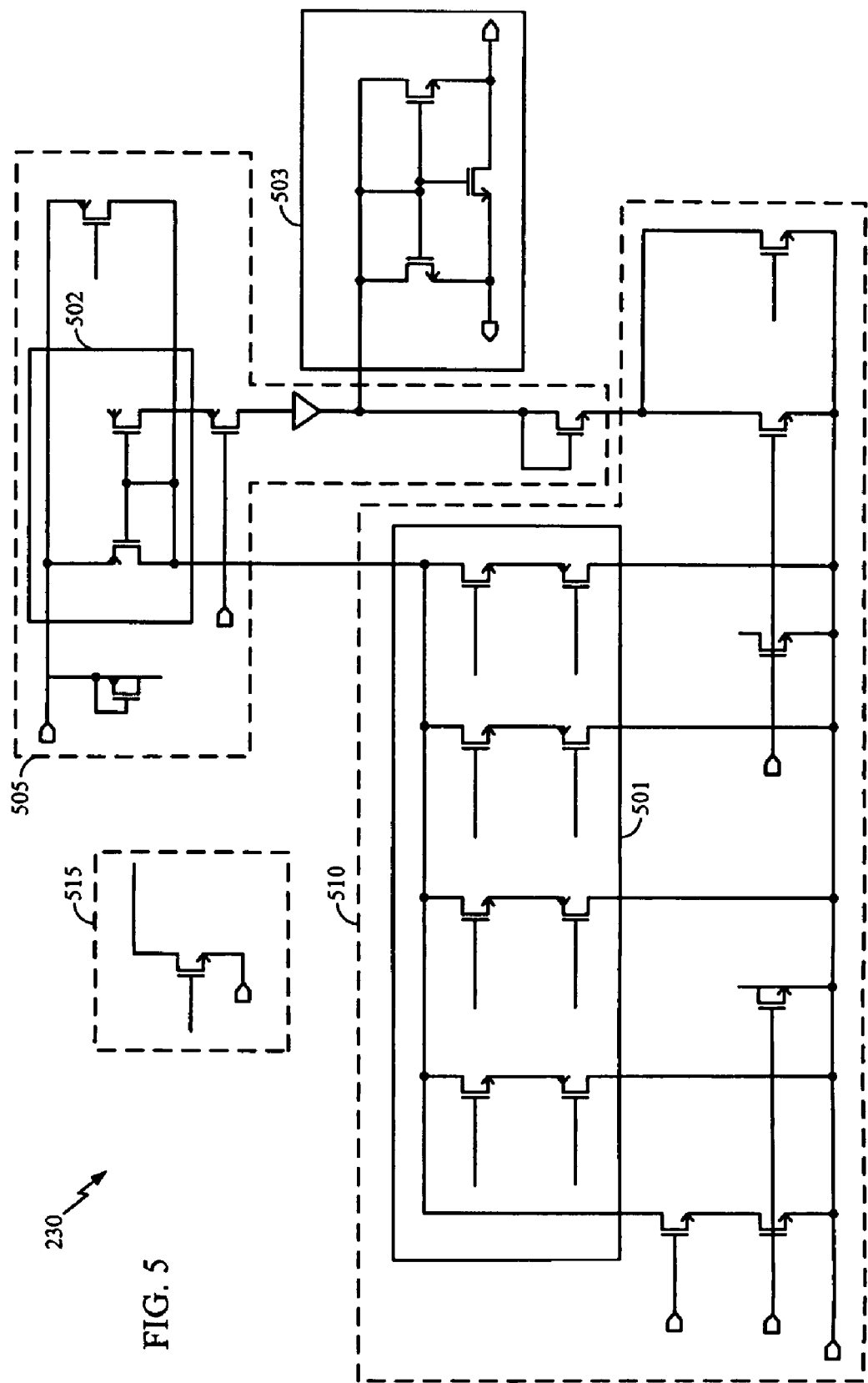
FIGS. 5-5C are an illustration of an exemplary embodiment of a clamp, adapted for use in the amplifier of FIG. 2.

In this example, when the voltage on the gate of M77 is more than an NMOS $V_{th}$ and a PMOS $V_{th}$ above the gate of M58, transistors M77 and M58 turn on, and have a current-to-voltage profile that roughly approximates square law. The gates of M77 and M58 are connected to a constant voltage difference generated by passing a constant current through series resistors R2-R9 and R12 (FIG. 3B). Transistors M77 and M58 drive this constant current through resistors R2-R9 and R12 to generate the constant voltage difference, which corresponds to the nominal trigger point of the clamp sensor 501 (FIG. 5). In this particular example, the constant voltage is 1.28V across the gates of transistors M77 and M58.

The voltage across the gates of transistors M77 and M58 causes some current to flow into cascoded and diode-connected transistors M116 and M76. Transistors M116 and M76 produce the nAdjThr signal, which corresponds to a nominal current that flows through the clamp sensor 501 (FIG. 5) when the clamp sensor senses 1.28 volts. The nAdjThr signal should be substantially constant in this embodiment, but does vary over process and temperature and voltage to allow the clamp 230 to subtract the nominal current that flows through the clamp sensor 501 when the clamp sensor 501 senses 1.28 volts from the actual clamp sensor 501 current. Thus, the circuit including the transistors M77 and M58, resistors R2-R9 and R12, and transistors M116 and M76 (FIG. 3E) allows for the correction of process and temperature variations in clamp 230 by varying the nAdjThr signal so that variations in the nominal current through the clamp sensor are cancelled.

Various embodiments of the invention use the nAdjThr signal to recreate the expected current that corresponds to sensing 1.28V. The expected current is then subtracted from current from an actual sensor (shown in FIG. 5). When the difference current is positive, it indicates that the voltage at oP and oM is above 1.28V, its target voltage.

Figure 2D:
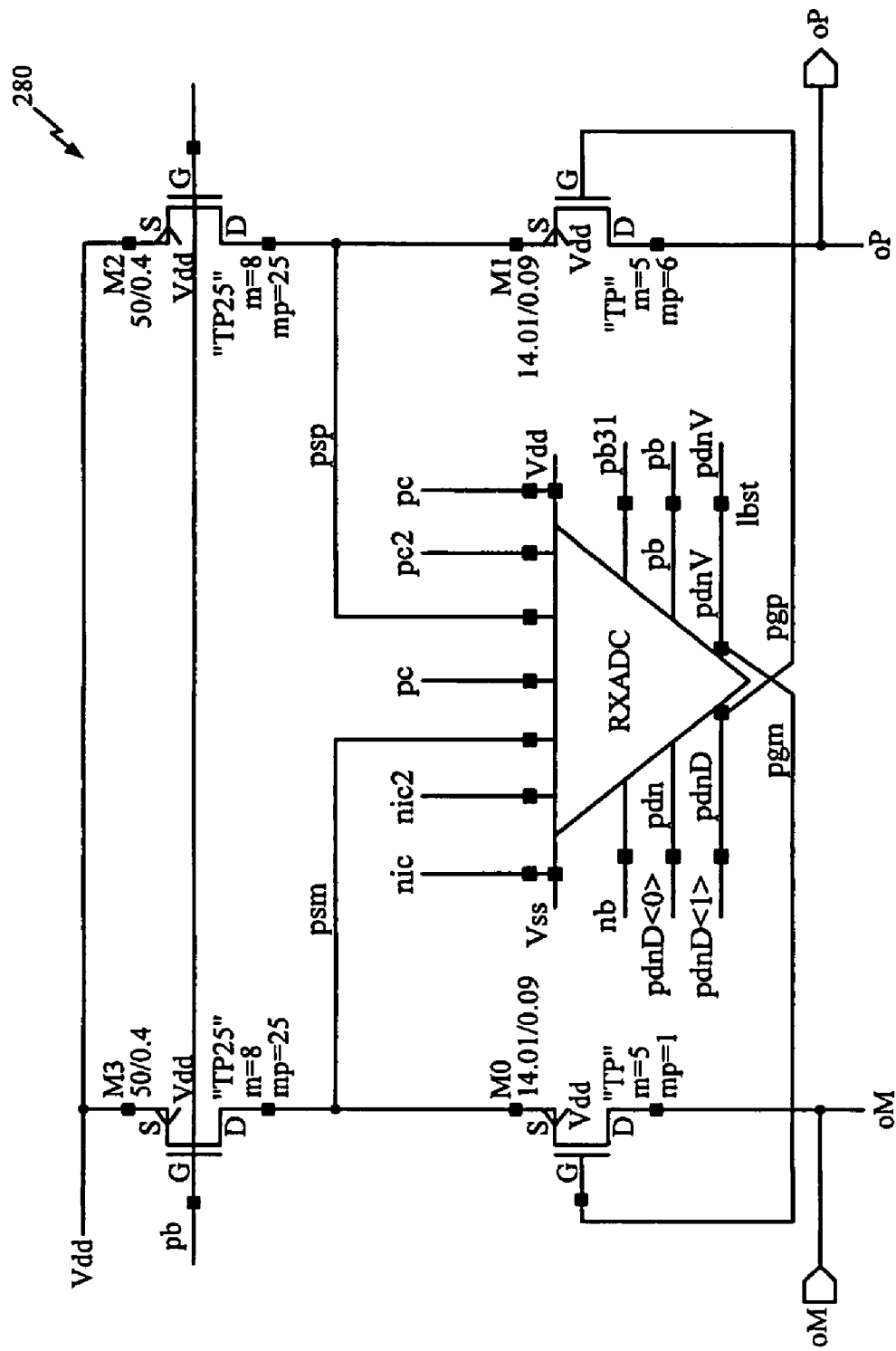
Figure 2E:
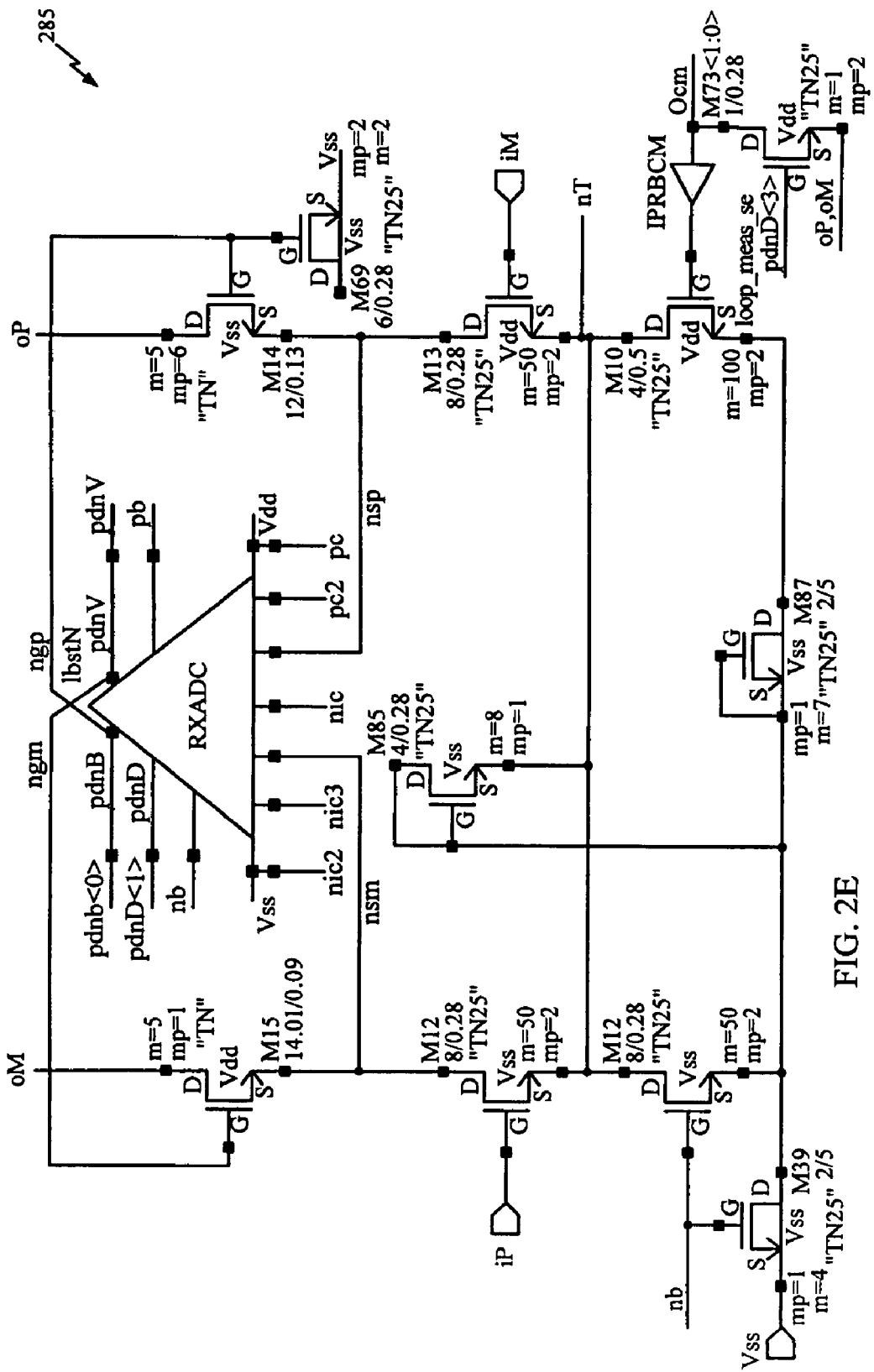

Returning to FIG. 2, various embodiments of the invention use clamp 230 to protect thin-oxide transistors M0, M1, M14, and M15 (FIGS. 2D-E). Clamp 230 keeps the voltage at oM and oP within a safe range and also releases the voltage very quickly once the over-voltage condition goes away.

The output of example amplifier 200 is a substantially constant 1.2 mA of current, with output voltage nominally at 1.28V. Clamp 230 regulates the voltage at oM and oP by providing or counteracting up to the full 1.2 mA of current at the output nodes when needed. Further, in this example, transistors M0, M1, M14, and M15 are nominally rated at about 1.3V and due to longer-than-minimum gate lengths have a safe maximum operating source-drain voltage $V_{sd}$ voltage of about 1.46V.

Figure 4:
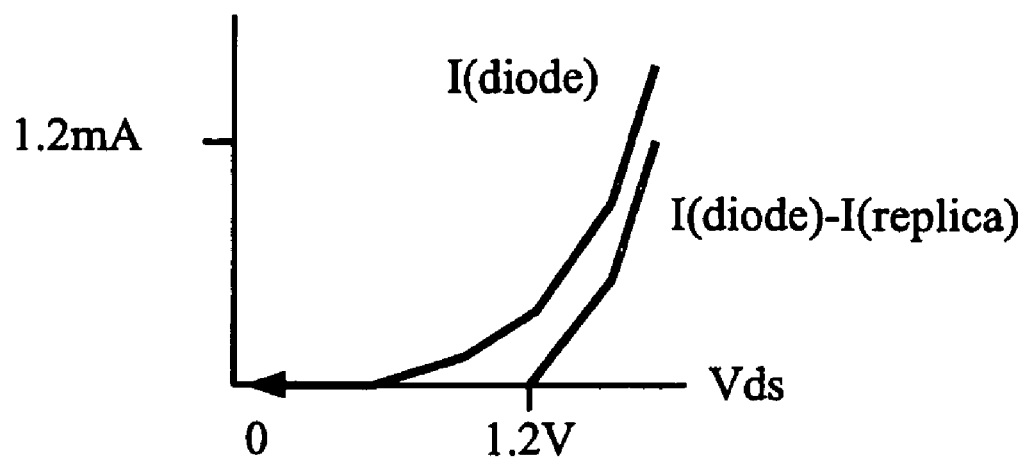
FIG. 4 is an illustration of two voltage/current relationships, wherein the signal $I_{diode}$ minus $I_{replica}$ can be used by one or more embodiments to operate the clamping circuit of FIG. 5.

In an over-voltage condition, clamp 230 keeps Vsd at less than 1.46 volts by counteracting current at oP and oM. Thus, as the differential voltage at oP and oM nears 1.46V, the current produced by clamp 230 nears 1.2 mA, thereby bringing the voltage back down. When the differential voltage at oP and oM nears 1.28V, current produced by clamp 230 nears zero. The relationship of the voltage at oP and oM to the current produced by clamp 230 is shown in FIG. 4. In FIG. 4, $I_{diode}$ is an approximate square law current signal produced by the clamp sensors shown in FIG. 5. Various embodiments of the invention use a difference current to activate clamp circuitry, and the difference current is shown in FIG. 4 as $I_{diode}$ minus $I_{replica}$. $I_{replica}$ is the current that corresponds to the nAdjThr signal. As can be seen from FIG. 4, the difference current has a steeper slope than does $I_{diode}$, thereby providing quicker clamp circuit operation.

Figure 5A:
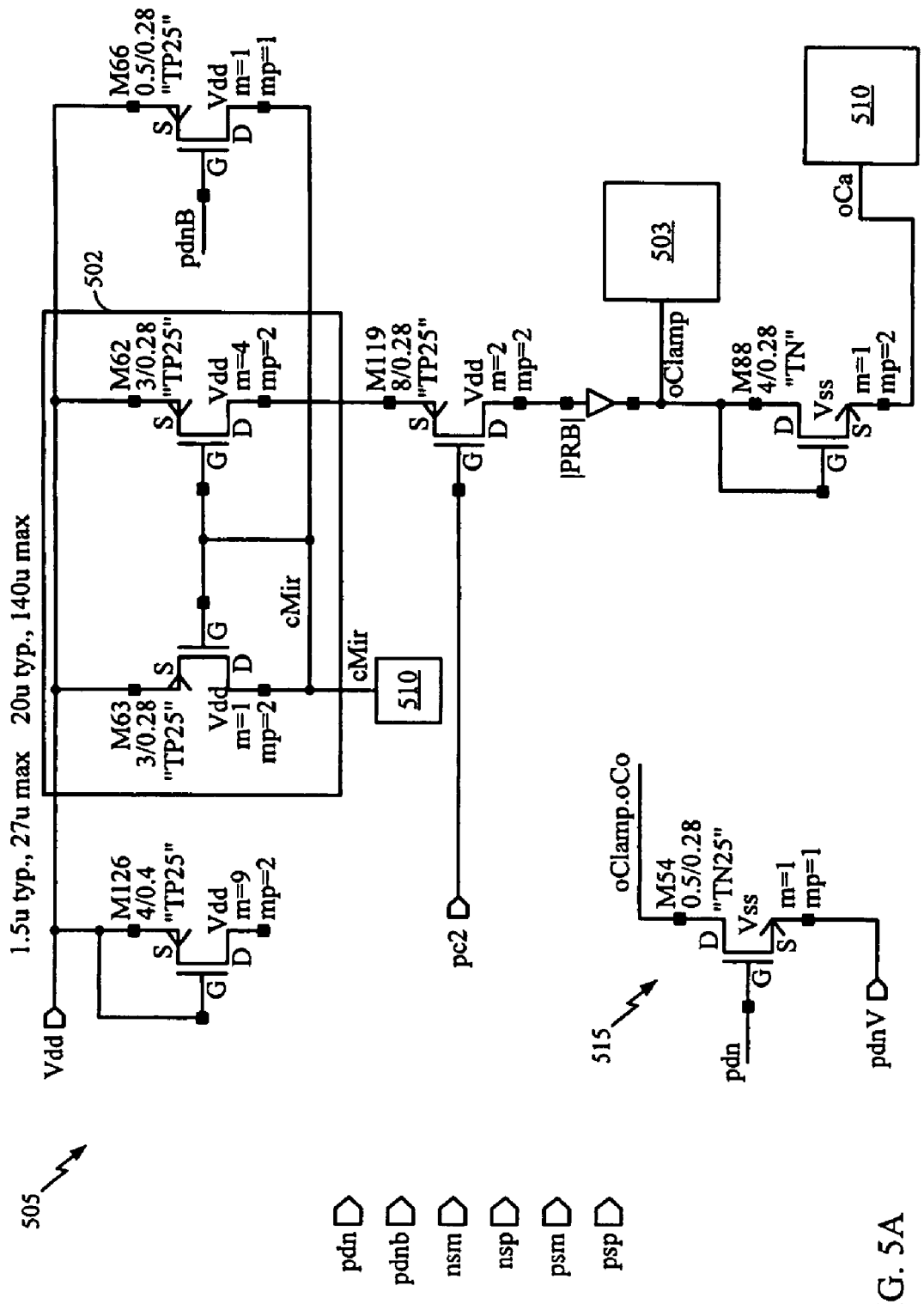
Figure 5B:
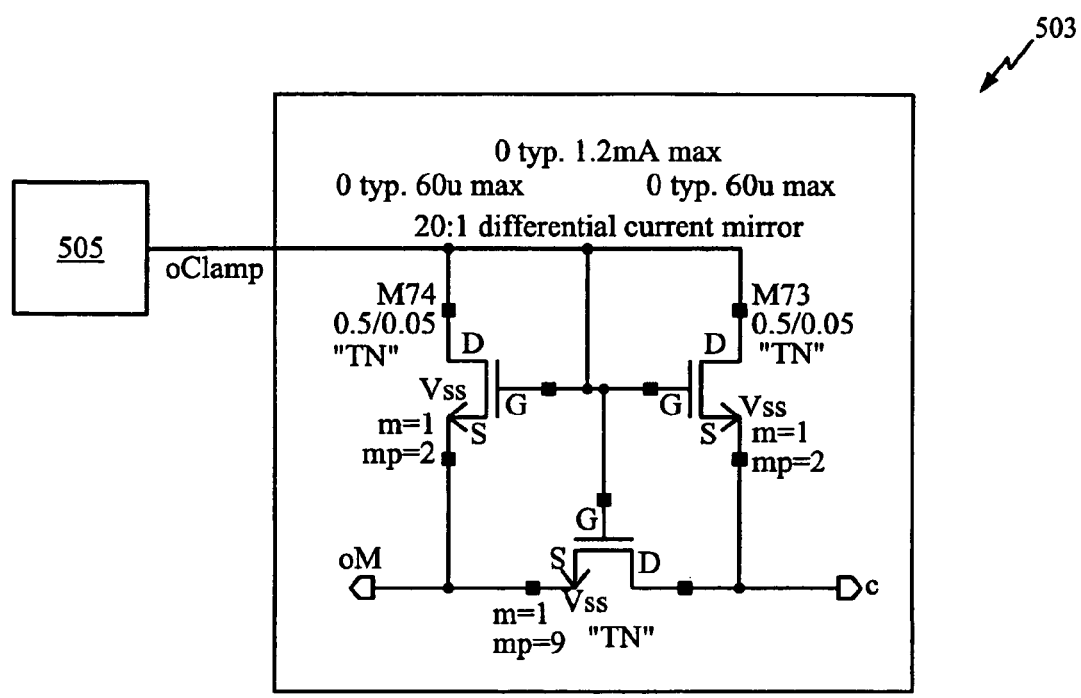
Figure 5C:
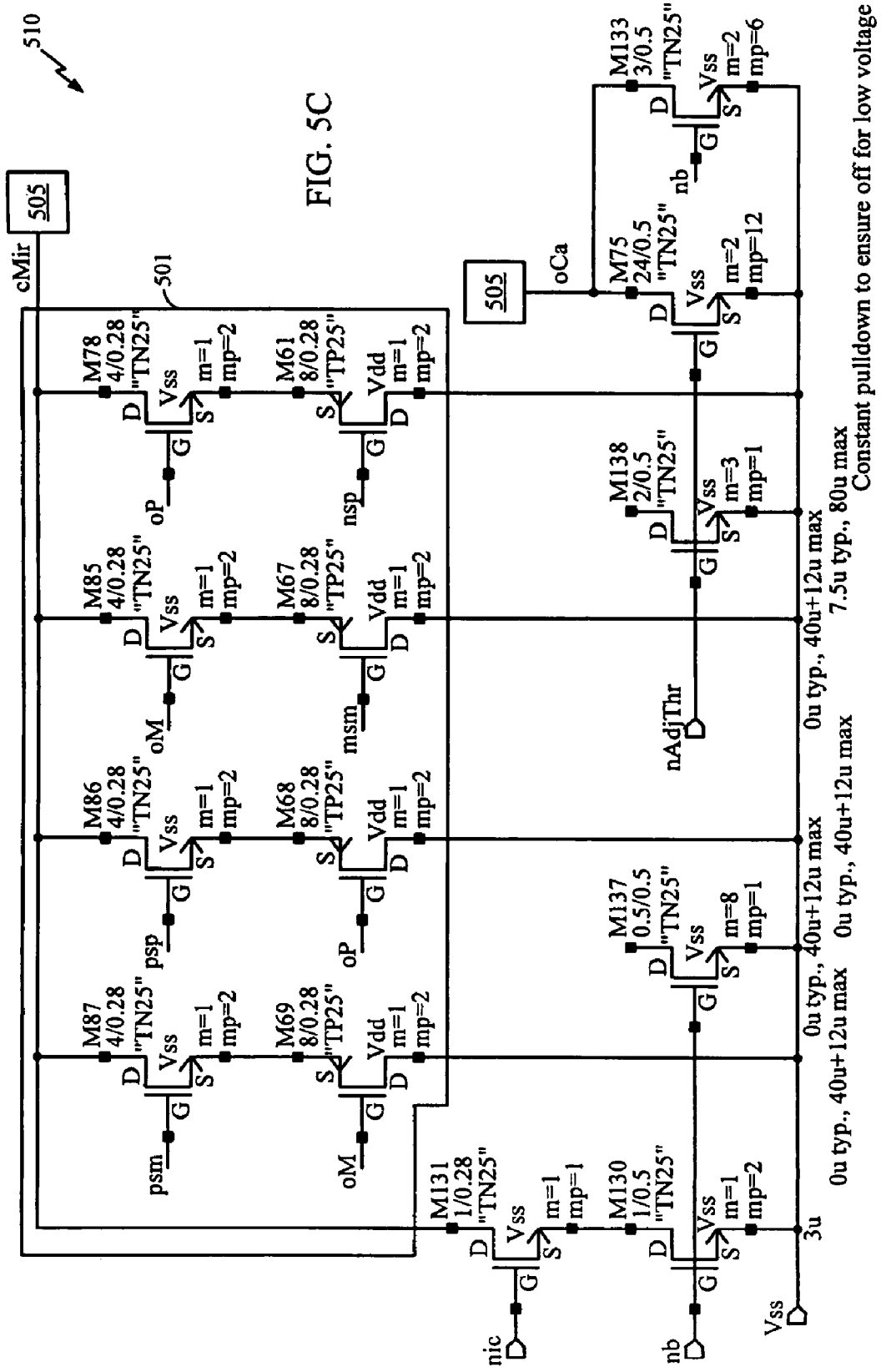

FIGS. 5-5C are an illustration of an exemplary embodiment of clamp 230, adapted for use in amplifier 200. Clamp 230, in this embodiment, includes, among other things, sensor 501, current mirror 502, and clamp circuit 503.

Sensor 501 (FIG. 5C) includes four detectors, each detector including one NMOS and one PMOS transistor. The leftmost detector includes M87 and M69 and it is connected to oM, the output of core amplifier 201 (which is a drain) and psm, which is at the source of M0. The next detector includes transistors M86 and M68, and it is connected to oP, another output of core amplifier 201, and psp, which is at a source of M1. The third detector includes M85 and M67, and it is connected to oM and nsm, which is at a source of M15. The right-most detector includes M78 and M61, and it is connected to oP and to nsp, which is at a source of M14. Sensor 501 produces a current corresponding to voltages in core amplifier 201. There is also a constant trickle current from transistor M130 that keeps current mirror 502 on.

Current produced by sensor 501 is mirrored by current mirror 502 (FIG. 5A), which is a 4× current mirror in this example. The mirrored current goes to node oClamp by clamp circuit 503. Transistors M75 and M133 produce a current that is subtracted from the current from current mirror 502. The nAdjThr signal is supplied to the gates of transistors M75 and M133, so that the nAdjThr signal is used to produce the replica current ($I_{replica}$), which is subtracted from the actual sensor current to produce a difference current. The difference current flows into clamp circuit 503.

It was mentioned above that transistor M130 produces a trickle current. Current mirror 502 mirrors the sum of the trickle current and the sensor current. At node oClamp, six times the trickle current is subtracted from the 4× mirrored current. Also at node oClamp, six times the current that flows into transistor M76 in FIG. 3A (to produce voltage nAdjThr) is subtracted from the 4× mirrored current. Thus, node oClamp will remain low and the clamp completely off until the current mirror 502 produces a current larger than six times the nominal current produced by the replica clamp sensor (M58 and M77 in FIG. 3A) plus twice the trickle current from transistor M130. Since the current mirror produces 4 times the current of the sensor 501 plus the trickle current from transistor M130, the clamp remains completely off until the sensor 501 produces a current larger than 150% of the nominal current plus half the trickle current.

As long as the source/drain voltages (Vsd) of the detectors in sensor 501 are less than the 1.28 volt target voltage, the oClamp node will be pulled down because the entire current is being sunk by M75 and M133, and node oCa will be very close to ground. M88 is a diode-connected transistor, so there will be one gate/source voltage (Vgs) of about 0.6V. The oClamp node will then be at about one Vgs above ground, thereby guaranteeing that clamp circuit 503 is off when sensor 501 detects a voltage of 1.28 or less.

Sensor 501 produces more current as the voltage as oM and oP gets higher. When the voltage at oM and oP is higher than 1.28V (an over-voltage condition), more current is being produced by 4× mirror 502 than is being sunk by M75 and M133. In such a scenario, current flows into clamp circuit 503.

Clamp circuit 503 (FIG. 5B) includes three transistors M74, M73, and Mclamp. Mclamp shorts the two outputs (oM and oP) of core amplifier 201 together. Clamp circuit 503 includes a 20:1 differential current mirror. Thus, any current coming from node oClamp into clamp circuit 503 results in twenty times as much current flowing, which is shorted across the outputs oM and oP. Clamp circuit 503 is a symmetrical device that produces current in one direction or the other depending on the polarity of the voltage at oM or oP. The current produced by the 20:1 current mirror is shorted to oM and oP, thereby lowering the voltage at oM and oP during an over-voltage condition.

During normal operation, node oClamp is a Vgs above ground, and oM and oP are stable enough to stay around the target voltage of 1.28V. Thus, in normal operation, current will not flow into clamp circuit 503. During an over-voltage condition, the differential voltage at oM and oP gets large, and some or all of the detectors gradually increase the current that flows into current mirror 502. The mirrored current is sent to the oClamp node. Current flowing into clamp circuit 503 is mirrored and shorted to oM and oP up to a maximum of 1.2 mA, which is the constant current of core amplifier 201. In a typical worst-case scenario, a very large voltage is applied to the inputs iP and iM of core amplifier 201, thereby causing core amplifier 201 to completely drive its current to one side (oM or oP). When the differential voltage across oM and oP gets above 1.28V, clamp circuit 503 starts applying current up to a maximum of 1.2 mA, thereby stabilizing the voltage at oM and oP. Therefore, clamp circuit 503 protects thin-oxide transistors M0, M1, M14, and M15 by regulating their input voltages to a safe operating range.

Figure 6:
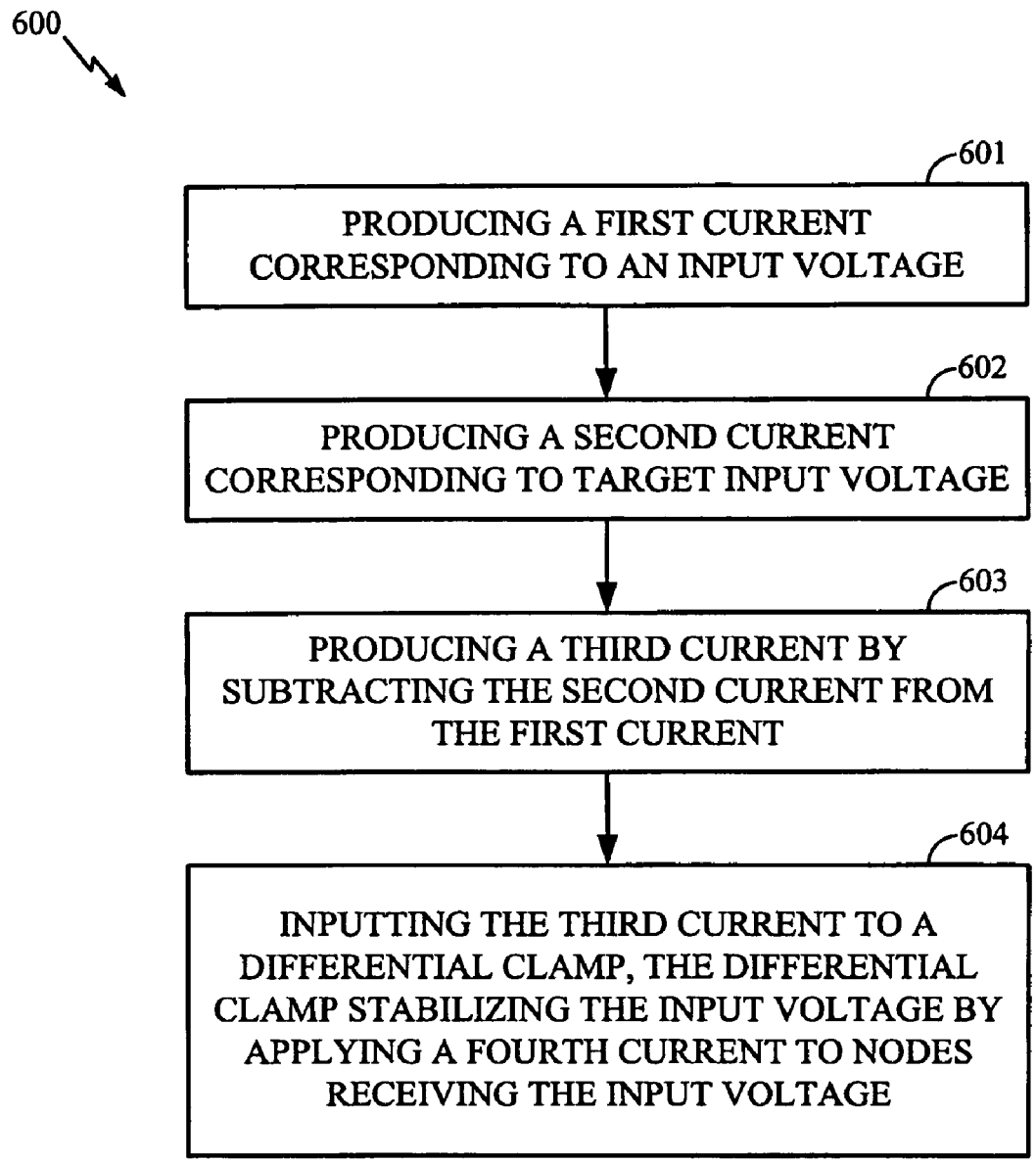
FIG. 6 is an illustration of an exemplary method adapted according to one embodiment of the invention.

FIG. 6 is an illustration of exemplary method 600 adapted according to one embodiment of the invention. Method 600 may be performed, in many embodiments, by circuitry operating according to the principles and concepts described above.

In step 601, a first current is produced, the first current corresponding to an input voltage. In some embodiments, the input voltage is an input voltage of one or more devices that should be kept within a safe operating range. For example, thin-oxide devices tend to have lower operating voltage ranges than do thick-oxide devices. However, various embodiments of the invention are not limited thereto, as the input voltage can be for a thick-oxide device, a thin-oxide device, or some other device. In the example embodiment of FIGS. 2-5, there are four input voltages, each being associated with one of transistors M0, M1, M14, and M15. In that example, the current corresponding to an input voltage is a mirrored current resulting from a square-law current produced from circuitry sensing the input voltage.

In step 602, a second current corresponding to a target input voltage is produced. The target input voltage in many embodiments is a voltage that falls within an operating range of one or more devices. For instance, in the example above, the target voltage corresponds to a safe operating voltage for four thin-oxide transistors. In that example, a signal (nAdjThr) is used to produce a constant current that draws down a node that also receives the first current.

In step 603, a third current is produced by subtracting the second current from the first current. Thus, when the first current is larger than the second current, the third current is positive. In the examples above, production of the third current is indicative of an over-voltage condition at one or more of transistors M0, M1, M14, and M15.

In step 604, the third current is input to a differential clamp. The differential clamp uses the third current to stabilize the input voltage by producing a fourth current and applying the fourth current to nodes connected to the input voltage. In the example above, the clamp is in a feedback loop during an over-voltage condition, acting as a constant current source so that the current applied from the clamp circuit displaces current produced by an amplifier, thereby regulating (limiting) the voltage at the nodes.

Method 600 is shown as a series of discrete steps. However, the invention is not so limited. For instance, in many embodiments, steps 601-604 are performed continuously and are perceived to occur simultaneously and in real time. Further, various embodiments may add, delete, modify, or rearrange some steps.

Embodiments of the invention may include one or more advantages over prior art solutions. For instance, clamping techniques, such as those described above, can be used to regulate voltages quickly and effectively. Effective voltage regulation can facilitate the use of thin-oxide devices in circuits that have normal operating voltages above the operating voltages of the thin-oxide devices. For instance, in the example embodiment of FIG. 2, transistors M0, M1, M14, and M15 are thin-oxide devices that operate in the 1.3V range, whereas other circuitry of core amplifier 201 operates in the 2.5V range.

Further, triggering a clamp circuit from a difference current, rather than from a current that directly models an input voltage, allows for sharper response. As shown in FIG. 4, the current $I_{diode}$ minus $I_{replica}$ shows a steeper slope that does $I_{diode}$. The steeper slope provides faster response in the range of operation. Additionally, the current $I_{diode}$ minus $I_{replica}$ shows zero current when the input voltage is at or below 1.28V, so that the clamp is off when the voltage is in an optimal range.

Although specific circuitry has been set forth, it will be appreciated by those skilled in the art that not all of the disclosed circuitry is required to practice the invention. Moreover, certain well known circuits have not been described, to maintain focus on the invention.

It should also be further noted that while specific voltage and current ranges, transistor types (e.g., NMOS), and configurations have been shown, various embodiments of the invention are not limited thereto. In fact, voltage and current ranges, as well as sizes and types of transistors and circuit architecture may be adapted to a variety of systems, each system suggesting one or more changes to the embodiments shown in FIGS. 1-6.

Although the present invention and its advantages have been described in detail, it should be understood that various changes, substitutions and alterations can be made herein without departing from the spirit and scope of the invention as defined by the appended claims. For example, although a read operation has been used in the discussion, it is envisioned that the invention equally applies to write operations. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An active over-voltage clamp system, said system comprising:
   at least one over-voltage detector that is responsive to an input voltage and provides a first current;
   a replica over-voltage circuit that provides a second current;
   circuitry subtracting the second current from the first current to produce a difference current; and
   a differential clamp activated in response to the difference current, wherein the differential clamp prevents the input voltage from increasing beyond a target voltage.

2. The system of claim 1 wherein the input voltage comprises a differential voltage.

3. The system of claim 1 further comprising:
   thin-oxide devices at nodes receiving the input voltage, wherein the target voltage is set at an operating voltage for the thin-oxide devices.

4. The system of claim 3 wherein the thin-oxide devices are included in an amplifier circuit that has an operating voltage above the target voltage.

5. The system of claim 1 wherein the subtracting circuitry comprises:
   a current mirror providing current to an input node of the differential clamp.

6. The system of claim 1 further comprising:
   an amplifier circuit, wherein an output of the amplifier circuit comprises the input voltage; and wherein the differential clamp shorts the output of the amplifier circuit and applies a current associated with the difference current, thereby keeping the input voltage substantially at the target voltage.

7. The system of claim 1 wherein the second current is a constant current corresponding to the target voltage.

8. The system of claim 1 wherein the difference current is zero when the input voltage is equal to the target voltage.

9. The system of claim 8 wherein the differential clamp is off when the difference current is equal to zero.

10. The system of claim 1 wherein the differential clamp comprises:
    a current mirror multiplying the difference current and applying the multiplied difference current to an amplifier node to lower the input voltage.

11. A method for stabilizing an input voltage, the method comprising:
    producing a first current corresponding to an input voltage;
    producing a second current corresponding to a target input voltage;
    producing a third current by subtracting the second current from the first current;
    inputting the third current to a differential clamp, the differential clamp stabilizing the input voltage by applying a fourth current to nodes receiving the input voltage.

12. The method of claim 11 wherein producing a third current comprises:
    mirroring the first current;
    providing the mirrored first current to an input node of the differential clamp; and
    drawing the second current from the input node of the differential clamp.

13. The method of claim 11 wherein the first current is produced by a sensor circuit that senses an output of an amplifier circuit, the amplifier circuit output comprising the input voltage.

14. The method of claim 11 wherein the fourth current is produced by mirroring the third current in the differential clamp.

15. The method of claim 11 wherein the input voltage is stabilized at an output of an amplifier and an input of at least one thin-oxide device.

16. The method of claim 15 wherein stabilizing the input voltage comprises:
    maintaining the input voltage at an operating voltage of the at least one thin-oxide device, wherein the operating voltage of the at least one thin-oxide device is less than an operating voltage of the amplifier.

17. A system for driving signals, the system comprising:
    an amplifier circuit;
    one or more thin-oxide devices configured to receive output from the amplifier circuit and to use the amplifier output to drive said signals;
    circuitry producing a first current, the first current associated with a voltage of the amplifier output;
    circuitry producing a second current, the second current associated with a target operating voltage of the one or more thin-oxide devices; and
    a voltage clamp receiving a third current that comprises a difference between the first and second currents, the voltage clamp creating a fourth current from the third current and applying the fourth current to one or more nodes of the amplifier circuit to decrease the output voltage of the amplifier circuit.

18. The system of claim 17 wherein the system is employed in a data conversion device.

19. The system of claim 18 wherein the data conversion device is employed in a wireless mobile device.

20. The system of claim 18 wherein the data conversion device is employed in a wireless base station.

21. A system for protecting a device from an amplifier output voltage, the system comprising:
    means for generating a first current that is indicative of the amplifier output voltage;
    means for generating a second current that is indicative of a target voltage for the device;
    means for subtracting the second current from the first current to produce a third current; and
    means for receiving the third current and clamping the amplifier output voltage based at least in part on the third current.

22. The system of claim 21 wherein the device comprises a thin-oxide device.

* * * * *